(12) United States Patent
Lin et al.

(10) Patent No.: US 9,214,543 B2
(45) Date of Patent: Dec. 15, 2015

(54) INTEGRATION OF BOTTOM-UP METAL FILM DEPOSITION

(71) Applicant: TAIWAN SEMICONDUCTOR MANUFACTURING COMPANY, LTD., Hsinchu (TW)

(72) Inventors: Simon Su-Horng Lin, Hsinchu (TW); Chi-Ming Yang, Hsian-San District (TW); Chyi Shyuan Chern, Taipei (TW); Chin-Hsiang Lin, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 17 days.

(21) Appl. No.: 13/915,184

(22) Filed: Jun. 11, 2013

(65) Prior Publication Data
US 2013/0270617 A1    Oct. 17, 2013

Related U.S. Application Data

(60) Continuation of application No. 13/302,620, filed on Nov. 22, 2011, now abandoned, which is a division of application No. 12/702,525, filed on Feb. 9, 2010, now Pat. No. 8,088,685.

(51) Int. Cl.
*H01L 29/78* (2006.01)
*H01L 29/49* (2006.01)
*C23C 14/02* (2006.01)
*C23C 14/04* (2006.01)
(Continued)

(52) U.S. Cl.
CPC ............. *H01L 29/78* (2013.01); *C23C 14/022* (2013.01); *C23C 14/046* (2013.01); *C23C 14/18* (2013.01); *C23C 14/221* (2013.01); *C23C 16/0263* (2013.01); *C23C 16/045* (2013.01); *C23C 16/06* (2013.01); *C23C 16/48* (2013.01); *C23C 16/484* (2013.01); *H01L 21/2855* (2013.01); *H01L 21/28079* (2013.01); *H01L 21/28088* (2013.01); *H01L 21/28556* (2013.01); *H01L 21/76843* (2013.01); *H01L 21/76856* (2013.01); *H01L 21/76862* (2013.01); *H01L 21/76865* (2013.01);
(Continued)

(58) Field of Classification Search
CPC ................... H01L 21/02436; H01L 21/02441; H01L 21/02518; H01L 29/40; H01L 29/66409; H01L 29/783
See application file for complete search history.

(56) References Cited

U.S. PATENT DOCUMENTS 5,306,666 A    4/1994 Izumi
5,563,094 A    10/1996 Paoli et al.
(Continued)

FOREIGN PATENT DOCUMENTS

| CN | 101599445 | 12/2009 |
|---|---|---|
| JP | 2009-16782 | 1/2009 |
| JP | 2009-177144 | 8/2009 |

OTHER PUBLICATIONS

Office Action dated Dec. 15, 2013 from corresponding application No. CN 201010192803.3.

*Primary Examiner* — Cheung Lee
(74) *Attorney, Agent, or Firm* — Hauptman Ham, LLP

(57) ABSTRACT

A gate structure including a substrate and a gate dielectric layer formed over the substrate. The gate structure further includes a workfunction layer over the gate dielectric layer and spacers enclosing the gate dielectric layer and the workfunction layer. A top surface of a portion of the workfunction layer in contact with sidewalls of the spacer is a same distance from the gate dielectric layer as a top surface of a center portion of the work function layer.

20 Claims, 8 Drawing Sheets

(51) Int. Cl.
*C23C 14/18* (2006.01)
*C23C 14/22* (2006.01)
*C23C 16/02* (2006.01)
*C23C 16/04* (2006.01)
*C23C 16/06* (2006.01)
*C23C 16/48* (2006.01)
*H01L 21/28* (2006.01)
*H01L 21/285* (2006.01)
*H01L 21/768* (2006.01)
*H01L 29/66* (2006.01)

(52) U.S. Cl.
CPC ...... *H01L 21/76877* (2013.01); *H01L 29/4966* (2013.01); *H01L 29/66545* (2013.01)

(56) References Cited

U.S. PATENT DOCUMENTS

| | | |
|---|---|---|
| 6,808,758 B1 | 10/2004 | Thakur |
| 7,208,427 B2 | 4/2007 | Roeder et al. |
| 7,365,341 B2 | 4/2008 | Saito et al. |
| 2003/0073314 A1 | 4/2003 | Skinner et al. |
| 2004/0124537 A1 | 7/2004 | Takayama et al. |
| 2006/0065939 A1* | 3/2006 | Doczy et al. ............ 257/412 |
| 2006/0166424 A1* | 7/2006 | Schaeffer et al. ........ 438/199 |
| 2009/0087578 A1 | 4/2009 | Hautala |
| 2010/0052071 A1* | 3/2010 | Niimi et al. ............. 257/369 |
| 2012/0286372 A1* | 11/2012 | Lavoie et al. ........... 257/410 |

* cited by examiner

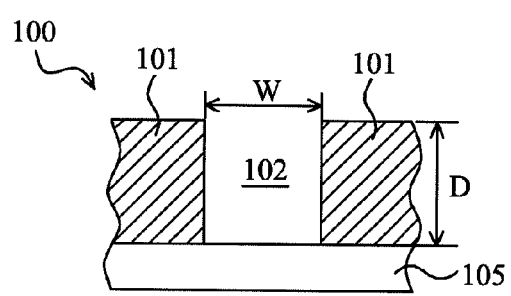
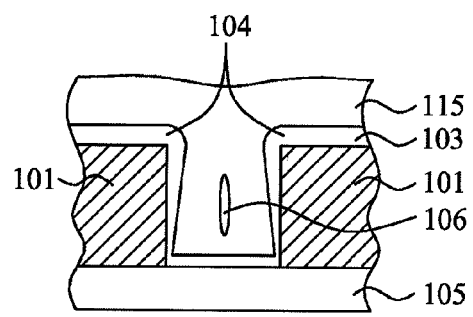
FIG. 1A    FIG. 1B
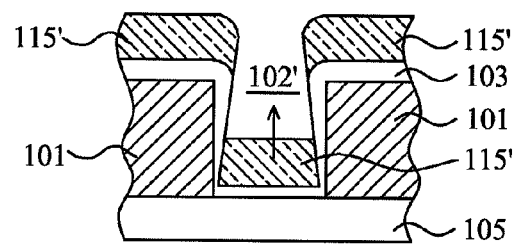
FIG. 1C

INTEGRATION OF BOTTOM-UP METAL FILM DEPOSITION

CROSS-REFERENCE TO RELATED APPLICATION

This application is a continuation of U.S. application Ser. No. 13/302,620, filed Nov. 22, 2011, which is a divisional of U.S. application Ser. No. 12/702,525, filed Feb. 9, 2010, which are incorporated herein by reference in their entireties.

FIELD

This disclosure relates to metal film deposition and, more particularly, to bottom-up metallization of fine semiconductor device structures with high aspect ratios.

BACKGROUND

The continuous effort to improve semiconductor device performance brings with it a continuous effort of scaling down device feature sizes thereby improving the device performance speed and its functional capability. With the reduction in device feature sizes, the performance of the device becomes increasingly more dependent on the interconnections that are required between functional devices. In order to improve the interconnect aspect of semiconductor design and to reduce the relative impact of the device interconnects, integrated circuits are typically fabricated using multiple level interconnect schemes. The multiple layers of interconnect metallization contained within these multi-chip modules are typically separated by alternating layers of an isolating dielectric, the layers of dielectric serve as electrical isolation between the metal features. The metal that is used to construct the interconnect metal features is selected based on such performance characteristics as low resistivity, resistance to electromigration, adhesion to the underlying substrate material, stability (both electrical and mechanical), and ease of processing. For these reasons, copper is often selected due to its low resistivity, high electromigration resistance, and stress voiding resistance. Diffusion barrier layer is often deposited to line the trenches and vias (holes). The diffusion barrier layer sometimes also acts as an adhesion-promoting layer. For contact plugs, tungsten (W) is often used to fill the plugs, not copper, to prevent copper from diffusing to the gate. An adhesion layer is also used to line the contact plugs. With the reduction in device feature sizes, gap-fill of contact, via, and trench structures becomes increasingly challenging.

In addition to metal interconnect, the fabrication of gate electrodes for complementary metal-oxide-semiconductor (CMOS) transistors using high dielectric constant (high-k) dielectric material and metal to replace silicon dioxide and polysilicon also has challenging metal gap-fill issues. A replacement metal gate process is often used to form the gate electrode. A typical replacement metal gate process begins by forming a high-k dielectric material and a sacrificial gate between a pair of spacers on a semiconductor substrate. After further processing steps, the sacrificial gate is removed and the resulting trench is filled with one or more metal layers. Filling the one or more metal layers in the resulting trench has also become increasingly difficult due to shrinking device features.

Gap-filling of trench, via, contact, and replacement gate structures with metal films without voids to have good electrical and reliability performance is critical for advanced processing technologies.

BRIEF DESCRIPTION OF THE DRAWINGS

In the accompanying drawings, like reference numerals designate like structural elements.

FIG. 1A shows an interconnect structure, in accordance with one embodiment of the present invention.

FIG. 1B shows metal layers being deposited to fill the opening, in accordance with one embodiment of the present invention.

FIG. 1C shows a bottom-up metal deposition being used to fill an opening, in accordance one embodiment of the present invention.

DETAILED DESCRIPTION OF THE EXEMPLARY EMBODIMENTS

Figure 2A:
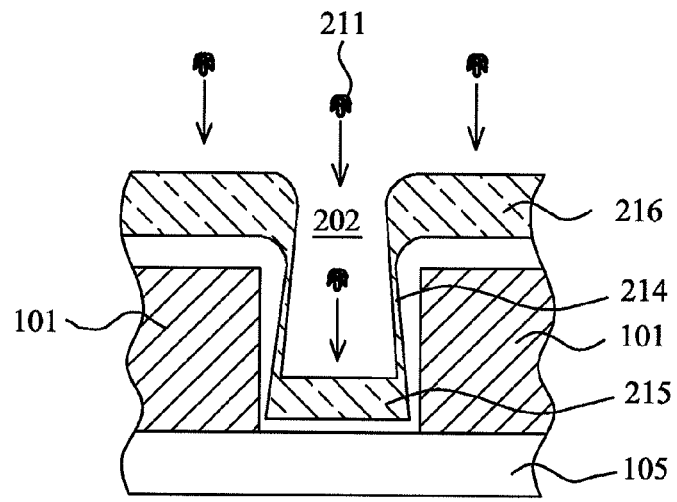
FIG. 2A shows directional ion clusters arriving at an opening with a barrier/adhesion layer underneath to deposit a metal film, in accordance with one embodiment of the present invention.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1A shows an interconnect structure 100, in accordance with one embodiment of the present invention. Structure 100 is formed by etching an opening 102 in a dielectric material 101. Structure 100 can be a trench, a via (hole), or a contact (hole). The dielectric material 101 can be on a substrate 105, which can be silicon or other types of materials. The substrate 105 can contain features and device regions. For example, underneath the opening 102, there can be a contact or a metal structure that provides electrical connection to device regions in the substrate 105 (not shown). In addition, the dielectric material 101 can be made of one single layer or can be made of more than one layer (such as: a composite layer). The opening 102 has a width "W" and a depth "D". With the advancement of semiconductor device technologies, the width "W" continues to shrink to allow more devices and to be built on a chip. However, the depth "D" (or thickness) of the dielectric material 101 does not decrease at the same rate as "W" to allow the metal resistance to stay relatively low. As a result, the aspect ratio (D/W) of structure 100 increases with the advancement of device technologies. For advanced processing technologies, such as 40 nm node, 28 nm node, 22 nm, or below, the smallest width of the opening can be 0.1 μm or smaller and the highest aspect ratio can be 1:1 or greater.

FIG. 1B shows metal layers being deposited to fill the opening, in accordance with one embodiment of the present invention. In the example shown in FIG. 1B, a barrier layer or an adhesion layer 103 is deposited to line the opening 102. The examples of the barrier layer 103 may include titanium (Ti), tantalum (Ta), titanium nitride (TiN), tantalum nitride (TaN), or a composite layer, such as Ti/TiN, Ta/TaN, etc. Layer 103 is often deposited by physical vapor deposition (PVD) process, which results in overhang near the opening (see corners 104). In some embodiments, layer 103 can be a composite layer with more than one sub-layer. After the barrier layer and/or adhesion layer 103 is deposited, a metal layer 115 is deposited. The examples of metal layer 105 may include copper, aluminum alloy, tungsten, or other applicable materials. Some exemplary processes usable to deposit metal layer 115 may include PCVD, chemical vapor deposition (CVD), electroplating, electroless deposition, etc. In some embodiments, a void 106 is often formed after the metal layer 115 is deposited. The poor step coverage of the barrier/adhesion layer 103 and the metal layer 115, the small feature size of opening 102, and the high aspect ratio of opening 102 all can contribute to the formation of void 106. Voids, such as void 106, in the metal film can trap impurities inside and can be opened up during the planarization process after the metal film deposition, such as chemical-mechanical planarization (CMP). A buried void or a void that is opened can degrade device yield and cause reliability problems, such as delamination and electromigration during reliability testing.

To improve device yield and to prevent reliability issues, it is desirable to have a metal deposition process that would produce void-free deposition. FIG. 1C shows a bottom-up metal deposition being used to fill an opening, in accordance one embodiment of the present invention. After the barrier/adhesion layer 103 is deposited, the size of the opening 102 is reduced to 102'. FIG. 1C also shows that opening 102' can be filled by a metal film 115' deposited by a bottom-up metal deposition process. The bottom-up metal deposition process is not a selective deposition process; therefore, the surface outside of the opening 102' is also deposited with the film 115'. A bottom-up metal deposition process fills the opening 102' from bottom up and does not have the step coverage issue associated with some other metal deposition processes. Such bottom-up metal deposition process can fill small openings with high aspect ratios, such as opening 102', without leaving a void behind. In addition, the bottom-up metal deposition process does not have the known problem of very narrow process window associated with a selective deposition process.

Gas cluster ion beams (GCIBs) can be used to provide a bottom-up metal deposition. The gas clusters are nano-sized aggregates of materials that are gaseous under conditions of standard and elevated temperature and pressure. When a gaseous material(s) is released into a vacuum chamber as a jet, the jet is inherently cooled as static enthalpy is exchanged for kinetic energy. The cooling results from expansion of the jet in the vacuum. A portion of the jet is rapidly cooled and condensed to form gas clusters. The gas clusters can be ionized by electron bombardment, which permits the gas clusters to be formed into directed beams of controllable energy. The ionized gas clusters can also be accelerated to attain a desired kinetic energy.

The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification, deposition, and etching processes, but without the tendency to produce deeper sub-surface damage that is characteristic of some other ion beam processing. An example of a GCIB apparatus can be found in U.S. Patent Publication No. 2009/0087578, filed on Sep. 29, 2007, and titled "Method for Depositing Films Using Gas Cluster Ion Beam Processing."

FIG. 2A shows directional ion clusters arriving at an opening with a barrier/adhesion layer underneath to deposit a metal film 215, in accordance with one embodiment of the present invention. FIG. 2A shows that the ion clusters 211 are directional and arrive at a direction perpendicular to the substrate surface. Since the ion clusters are directional, there is little or no deposition on surfaces parallel to the traveling direction of the ion clusters (sidewall of the opening 202). Such deposition characteristic eliminate the problems of having overhang and increasing aspect ratios associated with conventional PVD and CVD deposition, and enables void-free gap-fill. FIG. 2A shows that metal film 215 deposited on the bottom of the opening 202 and metal film 216 deposited on the top of the substrate surface are much thicker than metal film 214 deposited on the sidewall of opening 202. In at least one embodiment, the thickness of metal film 214 is about zero (almost no deposition).

Figure 2B:
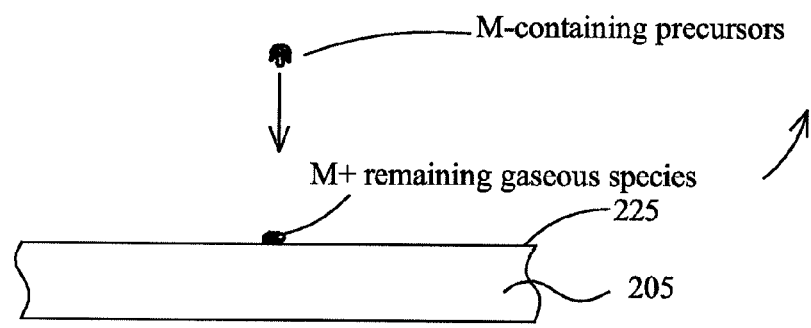
FIG. 2B shows ion clusters dissociated into metal and remaining gaseous species when the ion clusters hit a substrate surface, in accordance with one embodiment of the present invention.

Referring to FIG. 2B, the gas clusters are formed by releasing a metal-containing gaseous precursor(s), such as metal organic precursor or metal halide, into a vacuum chamber. The clusters can be ionized and filtered to travel in a direction perpendicular to a surface 225 of a substrate 205. The ion clusters can also be accelerated by an electric field to attain a desired kinetic energy and would dissociate into metal and remaining gaseous species when the ion clusters hit the substrate surface 225, as shown in FIG. 2B in accordance with one embodiment of the present invention. In some embodiments, the ion clusters can contain a few to several thousand molecules. The ion clusters can have kinetic energy ranges form about 1 keV to several tens of keV, such as 1 keV to 90 keV. Upon the ion clusters impacting the substrate surface 225, the kinetic energy is transformed into localized high temperature, which helps to release (or drive) the gaseous species out of the deposited metal film.

As mentioned above, in some embodiments, the gas used to deposit a metal film by GCIB can be a metal-containing gas precursor, which can include metal organic precursors, and metal halides. The metal organic precursor(s) can be in liquid form at room temperature (between about 15° C. to about 30° C.) and can be brought into gas form by an inert carrier gas, such as He, Ne, Ar, Kr, Xe, or Rn. In other alternative embodiments, the gas used to deposit the metal film can be a mixture with two or more types of gases that do not react at room temperature or low temperature, such as between room temperature and about 200° C. When the ion clusters of the gas mixture hit the substrate surface, the kinetic energy of the ion clusters is converted into thermal energy, which results in very high local temperature (such as >400° C.), which enables the gas mixture to react to form the metal film with residual gas species that would leave the substrate surface. For example, the gas mixture can include $WF_6$ and $SiH_4$, which would react at >400° C. to form W and HF, $H_2$ gases. Only W will remain on the substrate surface, HF and $H_2$ would leave the substrate surface.

GCIB can be used to deposit various types of metal films, such as copper, aluminum, tungsten, titanium, tantalum, and any metal film that has a gaseous precursor. GCIB can also be used to deposit metal-containing films. For example, the common barrier and adhesion films, TiN, TaN, can be deposited by mixing a gaseous metal-containing precursor with a nitrogen containing gas, such as $N_2$, $NH_3$. However, in some embodiments, GCIB is not suitable to be used to deposit a barrier/adhesion layer that is used to line an opening, such as opening 102 of FIG. 1A, because the film deposited by GCIB does not provide sufficient coverage on the sidewalls of the opening.

A well-known concern of copper integration is the adhesion between copper and barrier layer. The barrier layer for copper, such as TiN or TaN, tends to oxidize on the surface when the film is exposed to air. Copper does not adhere well to the oxidized barrier layer. GCIB with an inert gas, such as Ar or He, can be used to remove the top surface of the barrier layer, which is oxidized, in situ (in the same reactor) before the copper film is deposited by GCIB. In this case, the top surface of the barrier layer is removed by impeding clusters of Ar or He molecules. The removal mechanism is similar to argon sputtering. In-situ surface treatment before metal film deposition has the benefit of high throughput and limiting exposure to pre-treated surface to air before metal deposition. GCIB process chamber has the unique capability of performing pre-treatment and bottom-up metal deposition in a single chamber.

In other alternative embodiments, GCIB can use a hydrogen-containing gas for surface pre-treatment. The hydrogen-containing ion clusters can reduce the oxidized TiN or TaN layer into a metal rich layer, which would allow copper layer to adhere better to the barrier/adhesion layer. Such surface pre-treatment of underlying layer to improve adhesion can also be applied to other metal films deposited by GCIB, such as W, Al, Ta, Ti, etc.

Figure 3A:
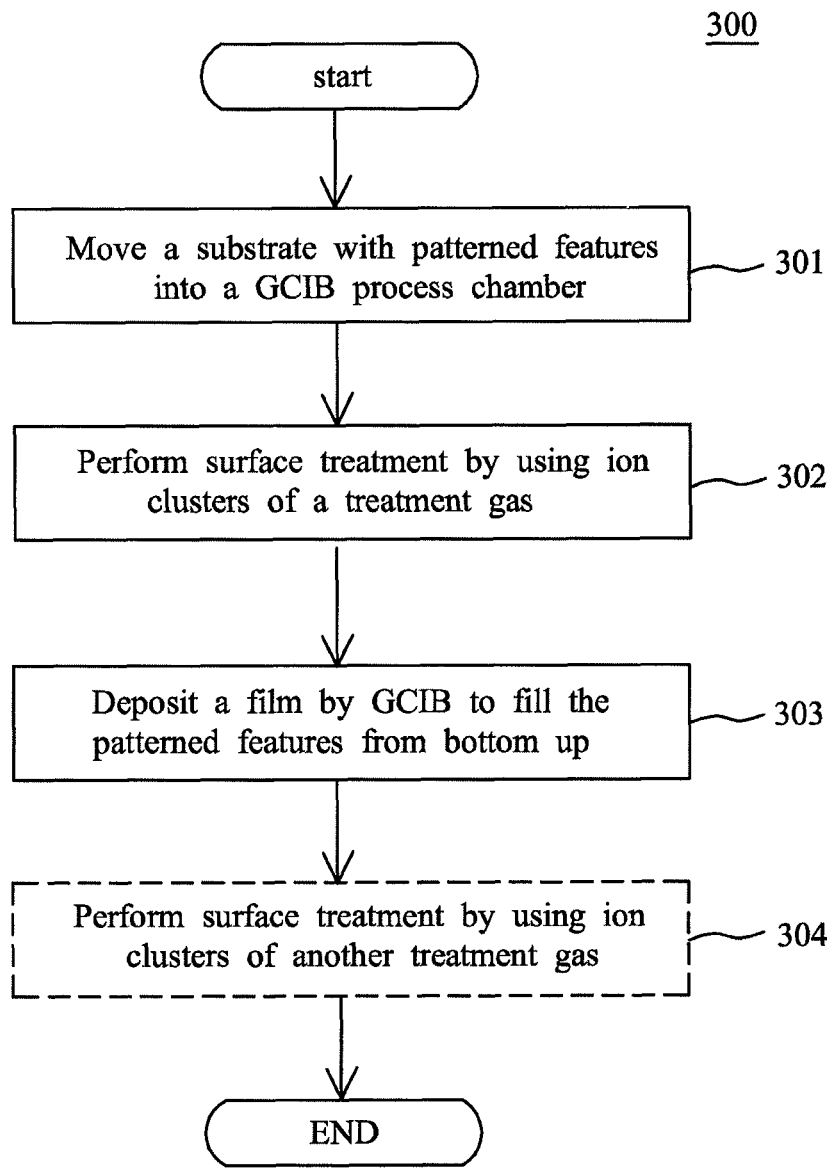
FIG. 3A shows a process flow for integrating surface pretreatment and film deposition in a GCIB process chamber, in accordance with one embodiment of the present invention.

FIG. 3A shows a process flow 300 for integrating surface pre-treatment and film deposition in a GCIB process chamber, in accordance with one embodiment of the present invention. At operation 301, a substrate with patterned features is moved into a GCIB processing chamber. At operation 302, a surface pre-treatment by using ion clusters of a treatment gas is performed. The pre-treatment can be removing a surface layer, such as by using an inert gas, or by reducing the surface layer. Other types of surface pre-treatments are also possible, such as converting the surface layer by incorporating a chemical compound. For example, a metal surface, such as Ti or Ta, can be converted into nitrogen-containing film, such as TiN or TaN, by treating the metal surface with a nitrogen-containing ion clusters. At operation 303, a film is deposited on the substrate right after the surface pre-treatment performed at operation 302 in the same chamber by GCIB to fill the patterned features on the substrate from bottom up. For example, the film deposited is a metal film. Other films, such as oxide film, a semiconductive layer or a barrier layer (such as TiN or TaN), can also be deposited. Depositing a metal film in the same process chamber right after substrate has been pre-treated allows minimal or no exposure of the substrate to the environment and prevent re-oxidation or contamination of the substrate surface. For metal film deposited over a barrier/adhesion layer, such as TiN or TaN, such pre-treatment can greatly improve the adhesion between the metal layer and the barrier/adhesion layer. In addition, the bottom-up filling by the GCIB process enables good gap-fill of small feature sizes with high aspect ratios.

Operation 303 can be followed by an optional operation 304. At operation 304, the film deposited at operation 303 is post-treated by GCIB. The post-treatment can include ion clusters of inert gas bombarding on the film to densify the film or to remove residual compounds that are left on the film surface, such as organic compounds from the metal-organic precursor. In other alternative embodiments, ion clusters of the post treatment can be formed by one or more reactive gas to change the surface of the film deposited at operation 303. For example, if the film deposited is a TiN film, whose surface needs to be metal rich, ion clusters formed by a hydrogen-containing gas can be used to make the film surface metal rich.

Figure 3B:
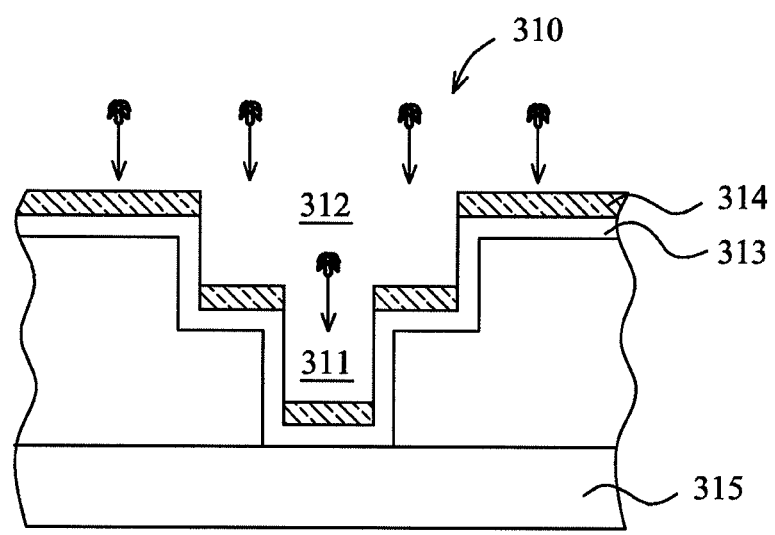
FIG. 3B shows a dual damascene structure being filled by a GCIB metal film, in accordance with one embodiment of the present invention.

The deposition method described above in process flow 300 not only can be used to deposit metal in structures shown in FIG. 2A, which can be contacts, vias, or trenches, but also to fill dual damascene structures, such as structure 310 of FIG. 3B, in accordance with one embodiment of the present invention. FIG. 3B shows a dual damascene structure with a via opening 311 and trench opening 312 over substrate 315, in accordance with one embodiment of the present invention. A barrier/adhesion layer 313 has been deposited to line the openings 311 and 312. As mentioned above, the barrier/adhesion layer 313 can be a composite layer. The via opening 311 is small and has high aspect ratio and is hard to fill. Using the process flow 300 to pre-treat the substrate surface and to deposit a bottom-up metal film 314 by GCIB can fill the openings 311 and 312 without leaving voids in the openings and the deposited film has good adhesion with the barrier/adhesion layer 313 underneath. The metal film 314 deposited by GCIB can be any conductive film, such as aluminum, copper, tungsten, etc.

Figure 3C:
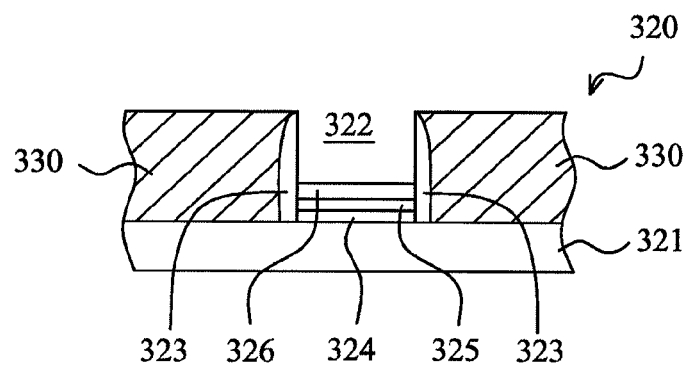
FIG. 3C shows a replacement gate structure, in accordance with one embodiment of the present invention.

In addition to filling interconnect structures, such as contacts, vias, and trenches, the process flow 300 can also be used to deposit metal-containing film(s) in a replacement gate structure. FIG. 3C shows a replacement gate structure 320 over a substrate 321, in accordance with one embodiment of the present invention. Structure 320 has an opening 322, which is enclosed by spacer 323, which is surrounded by a dielectric layer 330. The opening 322 is formed after a dummy gate, such as polysilicon, has been removed. Underneath the opening 322 and right above the substrate 321 is a high dielectric constant (high-K) layer 324. Underneath the high-K layer 324 there could be an interfacial oxide layer. Above the high-K dielectric layer is a barrier layer 325, which is used to protect the high-K layer 324. In at least one embodiment, there is a workfunction layer 326 above the barrier layer 325. The opening 322 needs to be filled with a gate material (a conductive layer), such as aluminum, or other type of metal with low resistivity.

Figure 3D:
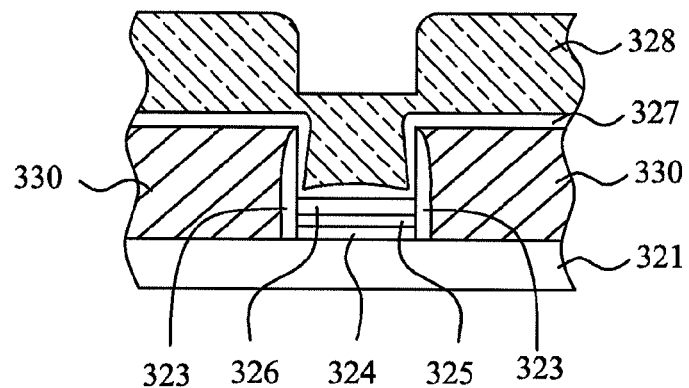
FIG. 3D shows the opening of FIG. 3C being filled with an optional barrier/adhesion layer and a gate metal layer, in accordance with one embodiment of the present invention.

For advanced technologies, the opening 322 could be very small and could have high aspect ratio. FIG. 3D shows the opening 322 of FIG. 3C being filled with an optional barrier/adhesion layer 327 and a gate metal layer 328, in accordance with one embodiment of the present invention. The barrier/adhesion layer 327 can be deposited by CVD, PVD, ALD, or other applicable process. The gate metal layer 328 is deposited by GCIB using the process flow 300 described above (with a surface pre-treatment before the metal film is deposited). For example, the barrier/adhesion layer 327 can be made of Ti, TiN, Ta, TaN, or a combination of Ti/TiN or Ta/TaN. As discussed above, to ensure good adhesion and good electro-migration, it's desirable to remove surface oxide or contaminants from the surface of the barrier/adhesion layer 327 or make the surface metal rich. In some embodiments, if the barrier/adhesion layer 327 is not needed, a surface treatment of the top layer underneath the gate metal layer, such as the workfunction layer 326, could be needed to remove surface oxide of the top layer. The bottom-up filling nature of films deposited by GCIB process enables gap-filling of small openings having high aspect ratio with good film quality and good adhesion for film(s) underneath.

Figure 3E:
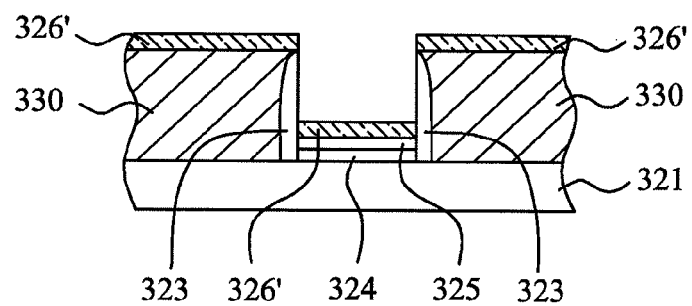
FIG. 3E shows a workfunction layer being deposited by GCIB in a replacement gate structure, in accordance with one embodiment of the present invention.

Other replacement gate processing flow could involve depositing a workfunction layer 326' after the dummy gate material is removed. FIG. 3E shows that the workfunction layer 326' is deposited by GCIB using the process flow 300 described above in a replacement gate structure, in accordance with one embodiment of the present invention. The workfunction layer can be an N-type workfunction layer or a P-type workfunction layer. Examples of materials for an N-type workfunction layer include, but not limited to, La, Zr, Hf, V, Nb, Ta, Ti, and metal carbides. In some embodiments, the workfunction material can include impurities. For example, the impurity used in providing the N-type workfunction shift is an element from the Lanthanide group. GCIB can be used to deposit metal films with impurity(ies) by introducing two different types of gas precursors into the processing chamber. Examples of P-type workfunction materials may include, but not limited to, Re, Fe, Ru, Co, Rh, Ir, Ni, Pd, and Pt. Pd can be used as an impurity in a P-type workfunction layer. To deposit the workfunction layer described above, gaseous metal precursor is introduced into the processing chamber. As mentioned above, the metal precursor can be mixed with a carrier gas. In addition, in some embodiments, another process gas can be introduced simultaneously. In at least one embodiment, there is one or more films between the barrier layer 325 and the workfunction layer 326'.

Figure 3F:
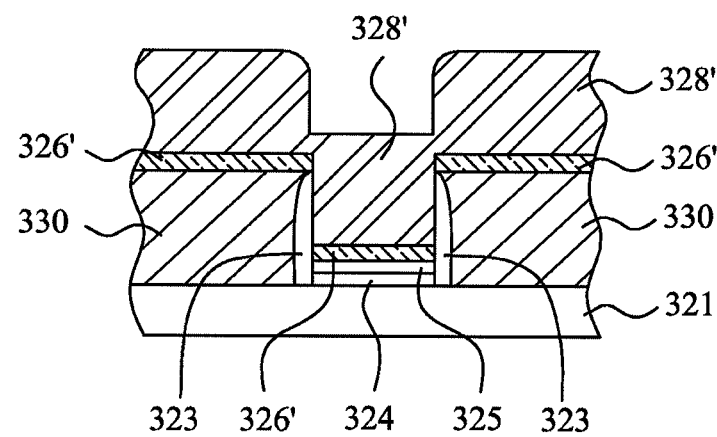
FIG. 3F shows a replacement gate structure being filled with a workfunction layer and a gate metal layer deposited by GCIB, in accordance with one embodiment of the present invention.

If a barrier/adhesion layer is not needed between the workfunction layer 326' and the gate metal layer 328', the gate metal layer 328' can be deposited in-situ in the same process chamber by using different process gas, as shown in FIG. 3F in accordance with one embodiment of the present invention. If the deposition is done in-situ, the pre-treatment process before the deposition of the workfunction layer can be optional. Alternatively, the deposition of the gate metal layer 328' can be performed in a separate GBIC chamber that is coupled to the GBIC chamber for depositing the workfunction layer 326'. If the gate metal layer 328' is performed in a separate chamber, a surface pre-treatment described in process flow 300 should be used again.

Figure 4A:
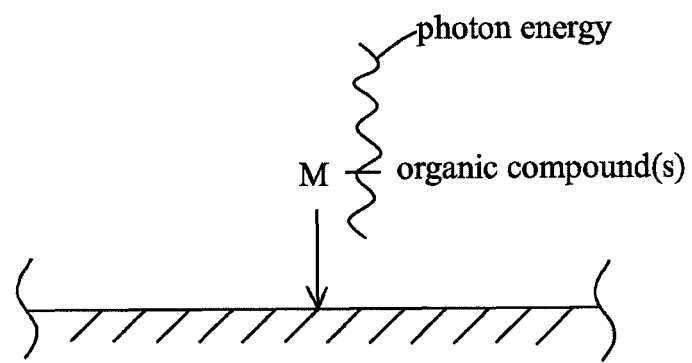
FIG. 4A shows photon energy breaking a bond between a metal molecule and an organic compound, in accordance with one embodiment of the present invention.
Figure 4B:
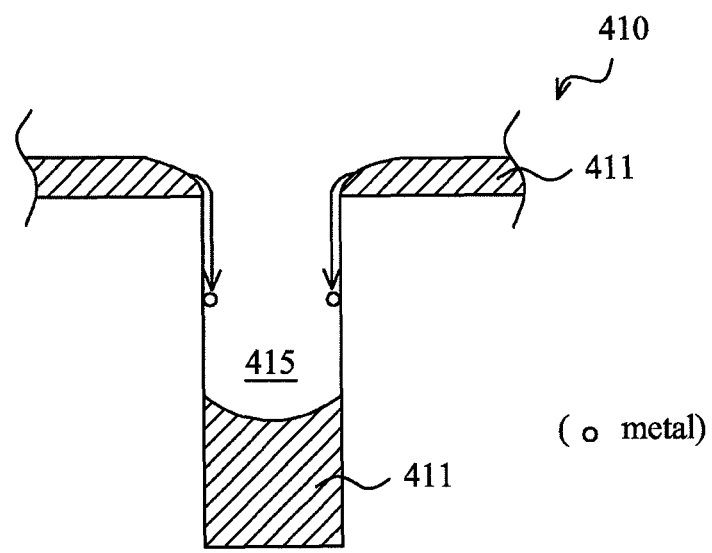
FIG. 4B shows an opening being filled by a metal deposited by photo induced chemical vapor deposition (PI-CVD), which exhibits liquid-like nature, in accordance with one embodiment of the present invention.

In addition to GBIC, photo-induced chemical vapor deposition (PI-CVD) can also provide bottom-up metal filling. A PI-CVD reactor is a CVD reactor with light source(s) that shines light on the process gas(es). The energy of the photons from the light source can break the bond between the metal molecule and the non-metallic molecule(s) bonded to the metal molecule. FIG. 4A shows photon energy breaking a bond between a metal molecule and an organic compound, in accordance with one embodiment of the present invention. The photons can be generated from low-frequency light sources, such as UV (ultraviolet), deep-UV, X-ray, or light with frequencies shorter than X-ray. Once broken off from the organic compound(s) attached to it, the metal molecule can be deposited on the substrate surface 401. The temperature of the deposition is relatively low. In at least one embodiment, the deposition temperature is between about room temperature (RT) to about 100° C. In another embodiment, the deposition temperature is between about RT (room temperature) to about 150° C. Due to the relative low deposition temperature, the metal molecules when deposited on the substrate surface exhibit liquid-like nature and move across substrate surface. The liquid-like nature of the metal molecules enables the metal molecules to move ("flow") to the bottom of the features, such as feature 410 of FIG. 4B, and to fill up the opening 415 from bottom up, in accordance with one embodiment of the present invention. In at least one embodiment, gravity assists the "flowing" of the liquid-like metal molecules into the openings to fill the openings from bottom up. The metal molecules are deposited on feature 410 as film 411.

The reactant sources for PI-CVD of metal film can include metal-organic precursors, metal halides, and any other metal-containing sources whose bonds can be broken by low-frequency light. The metal-containing sources can be liquid at room temperature. The metal organic precursor(s) can be in liquid form at room temperature and can be brought into gas form by an inert carrier gas, such as He, Ne, Ar, Kr, Xe, or Rn. In other alternative embodiments, the gas used to deposit the metal film can be a mixture with two or more types of gases that do not react at room temperature or low temperature, such as between room temperature and about 200° C. The photon energy enables the gas mixture to react to form the metal film with residual gas species that would leave the substrate surface. For example, the gas mixture can include $WF_6$ and $SiH_4$, which would react at >400° C. to form W and HF, $H_2$ gases. Only W will remain on the substrate surface, HF and $H_2$ would leave the substrate surface. If the residual gas is trapped in the film, a post deposition anneal (or annealing) can release the residual gaseous species from the film.

PI-CVD can be used to deposit various types of metal films, such as copper, aluminum, tungsten, titanium, tantalum, and any metal film that has a gaseous precursor. PI-CVD can also be used to deposit metal-containing films. For example, the common barrier and adhesion films, TiN, TaN, can be deposited by mixing a gaseous metal-containing precursor with a nitrogen containing gas, such as $N_2$, $NH_3$. PI-CVD is also suitable to deposit materials in stack gate from bottom up. For example, the films deposited by PI-CVD may include P-type workfunction or N-type work function materials described above.

As discussed above, various types of metal films deposited by PI-CVD can be used to fill interconnect and replacement gate. For advanced processing technologies that need to fill small features with high aspect ratios with metal, such bottom-up deposition nature of PI-CVD metal deposition can ensure good gap fill. The various structures described above for GCIB also can be filled by metal films deposited by PI-CVD.

Since the metal film is deposited at a relatively low temperature, a portion of the residual organic compounds, halides, or reaction byproduct(s) is very likely trapped and incorporated in the metal film 411. In some embodiments, to ensure that the deposited metal film is free of the residual compounds, a post deposition annealing is utilized to densify the film and to allow the residual compound(s) to leave the metal film via gas or vapor form. The annealing should be completed in a relative short period to ensure the thermal process do not alter the dopant profiles or device performance. In addition, in some embodiments, the annealing should not melt or vaporize the metal film(s) below the current deposited metal, if such underlying metal layer exists. A rapid thermal annealing utilizing rapid thermal processing (RTP), spike anneal, or laser anneal can be used. In other alternative embodiments, the annealing process is not a rapid thermal process, such as furnace anneal. If the annealing is performed at a lower temperature, longer process time (or annealing time) can be used without affecting the dopant profile or affecting the integrity of film(s) underneath the film being annealed. In some embodiments, if the annealing is for metallic films in the gate stack, the annealing temperature can be as high as 600° C.; for interconnect film(s), the annealing temperature should be kept to below about 450° C. or below about 400° C.

In at least one embodiment, the temperature of the annealing is between about 200° C. to about 450° C. for a duration between about 1 minute to about 30 minutes, such as for interconnect application. In another embodiment, the temperature of anneal is between about 300° C. to about 600° C. with a duration between about 1 minute to about 30 minutes (such as for front end application). The annealing process can be carried out in the same PI-CVD chamber (in-situ) or in a separate annealing chamber. In at least one embodiment, the annealing chamber is performed under vacuum to allow the residual gas (or byproducts) being pumped away from the metal film during the annealing process.

Figure 5:
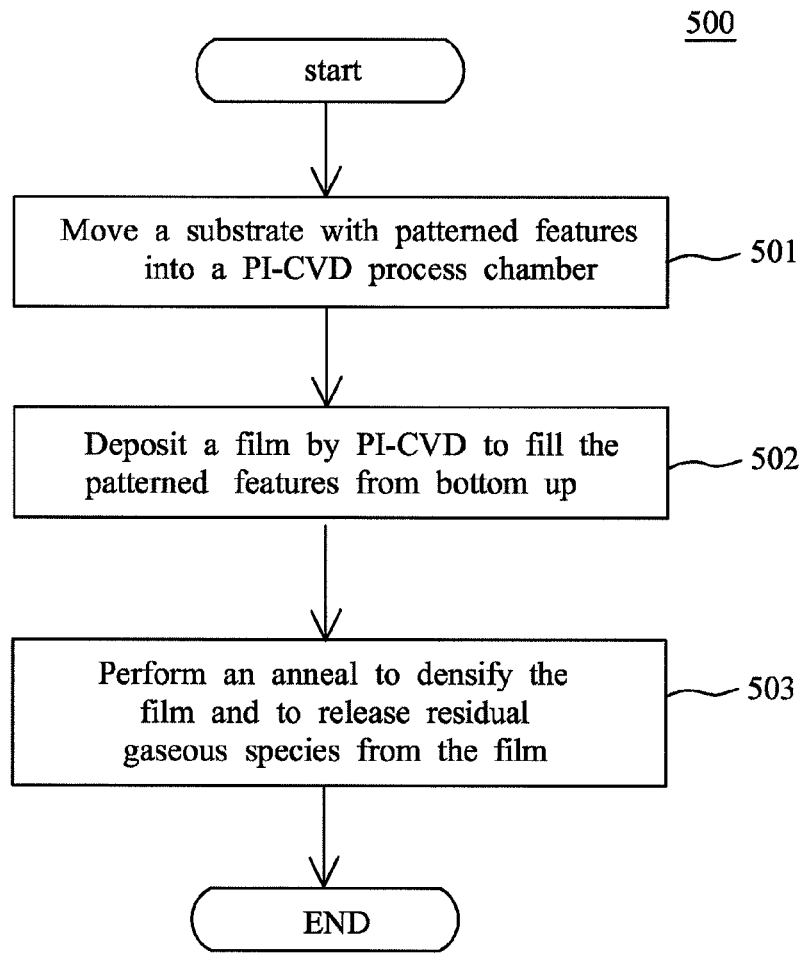
FIG. 5 shows a process flow for depositing a metal-containing film by PI-CVD on a patterned substrate followed by annealing, in accordance with one embodiment of the present invention.

FIG. 5 shows a process flow 500 for depositing a metal-containing film by PI-CVD on a patterned substrate followed by annealing, in accordance with one embodiment of the present invention. At operation 501, a substrate with patterned features is moved into a PI-CVD processing chamber. In at least one embodiment, the substrate is covered by a barrier/adhesion layer. In another embodiment, the surface of the substrate has undergone a pre-treatment, such as Ar-sputtering or hydrogen reduction to remove surface oxide, before the substrate is placed in the PI-CVD process chamber. At operation 502, a film is deposited on the substrate by a PI-CVD process to fill the patterned features from bottom up. In at least one embodiment, the film is a metal film. The bottom-up filling of metal film by PI-CVD enables good gap-fill of small feature sizes, such as features with openings equal to or smaller than about 0.1 µm. The bottom-up filling of metal film by PI-CVD also enables gap fill of small features sizes with aspect ratios greater than 1:1.

In at least one embodiment, the light source has a frequency less than ultra-violet (UV). Operation 502 is followed by operation 503. At operation 503, the substrate undergoes an annealing after the metal film is deposited at operation 502. In at least one embodiment, the annealing is a rapid annealing, which is performed at a temperature between 300° C. to about 450° C. for a duration between about 1 second to about 2 minutes. As described above, the annealing densifies the metal film and enables (or releases) the residual gaseous species from the metal film. As mentioned above, the annealing process is performed in the temperature range and time range that do not cause dopant profile changes and do not degrade any film underneath the deposited metal film.

The methods of bottom-up metal deposition to fill interconnect and replacement gate structures described above enable gap-filling of fine features, such as equal to or less than about 0.1 m, regardless of the aspect ratios of the fine features. The methods of bottom-up metal deposition to fill interconnect and replacement gate structures described above also enable gap-filling of fine features with aspect ratios, such as greater than 2:1. The in-situ pretreatment of metal film(s) deposited by GCIB allows removal of surface impurities and surface oxide to improve adhesion between the underlying layer with the deposited metal film(s). Metal films deposited by PI-CVD using high energy of low-frequency light source(s) at relatively low temperature exhibit liquid-like nature, which allows the metal films to fill fine feature from bottom up. The post deposition annealing of metal film(s) deposited by PI-CVD densifies the metal film(s) and removes residual gaseous species from the metal film(s) that is deposited at a relatively low temperature. Metal films deposited by GCIB and PI-CVD show limited deposition on the sidewalls of features (or openings). Such bottom-up filling characteristic is important, since during the film deposition, the sizes of the openings are not decreased and the aspect ratios of the openings (or features) are not increased. For advanced manufacturing, such bottom-up metal deposition methods address the challenges of gap-filling of fine features with high aspect ratios.

One aspect of this description relates to a gate structure including a substrate and a gate dielectric layer over the substrate. The gate structure further includes a workfunction layer over the gate dielectric layer and spacers enclosing the gate dielectric layer and the workfunction layer. A top surface of a portion of the workfunction layer in contact with sidewalls of the spacer is a same distance from the gate dielectric layer as a top surface of a center portion of the work function layer.

Another aspect of this description relates to a semiconductor device including a transistor. The transistor includes a substrate and a gate dielectric layer over the substrate. The transistor further includes a workfunction layer over the gate dielectric layer, wherein a top surface of a center portion of the workfunction layer is a first distance above a top surface of the gate dielectric layer. The transistor further includes spacers enclosing the gate dielectric layer and the workfunction layer, wherein sidewalls of the spacers more than the first distance above the top surface of the gate dielectric layer are free of the workfunction layer.

Still another aspect of this description relates to a gate structure including a substrate and a gate dielectric layer over the substrate. The gate structure further includes a workfunction layer over the gate dielectric layer, wherein a distance between a top surface of the gate dielectric layer and a top surface of the workfunction layer is constant across an entirety of the workfunction layer. The gate structure further includes spacers enclosing the gate dielectric layer and the workfunction layer.

Various modifications, changes, and variations apparent to those of skill in the art may be made in the arrangement, operation, and details of the methods and systems disclosed. Although some embodiments of the present invention have been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A semiconductor device comprising:
   a transistor, the transistor comprising:
   a substrate;
   a gate dielectric layer over the substrate;
   a workfunction layer over the gate dielectric layer, wherein a top surface of a center portion of the workfunction layer is a first distance above a top surface of the gate dielectric layer, wherein the first distance is from the top surface of the gate dielectric layer to the top surface of the center portion of the workfunction layer;
   a barrier layer between the gate dielectric layer and the workfunction layer, wherein the workfunction layer is over an entirety of a top surface of the barrier layer;
   spacers enclosing the gate dielectric layer and the workfunction layer, wherein an inner surface of sidewalls of the spacers located more than the first distance above the top surface of the gate dielectric layer are free of the workfunction layer;
   a gate electrode over the workfunction layer; and
   a dielectric layer surrounding the spacers, wherein a material of the gate electrode extends across a top surface of the dielectric layer.

2. The semiconductor device of claim 1, wherein the workfunction layer is an n-type work function layer and comprises at least one of La, Zr, Hf, V, Nb, Ta, Ti or a metal carbide.

3. The semiconductor device of claim 1, wherein the workfunction layer is a p-type work function layer and comprises at least one of Re, Fe, Ru, Co, Rh, Ir, Ni, Pd or Pt.

4. The semiconductor device of claim 1, wherein the gate electrode is a metal gate electrode.

5. The semiconductor device of claim 4, further comprising an adhesion layer between the gate electrode and the workfunction layer, wherein the adhesion layer comprises at least one of Ti, TiN, Ta, TaN.

6. A semiconductor device comprising:
   a transistor, the transistor comprising:
   a substrate;
   a gate dielectric layer over the substrate;
   a workfunction layer over the gate dielectric layer, wherein a top surface of a center portion of the workfunction layer is a first distance above a top surface of the gate dielectric layer, wherein the first distance is from the top surface of the gate dielectric layer to the top surface of the center portion of the workfunction layer;
   a barrier layer between the gate dielectric layer and the workfunction layer, wherein the workfunction layer is over an entirety of a top surface of the barrier layer;
   spacers enclosing the gate dielectric layer and the workfunction layer, wherein an inner surface of sidewalls of the spacers located more than the first distance above the top surface of the gate dielectric layer are free of the workfunction layer; and
   a gate electrode over the workfunction layer, wherein a top surface of the gate electrode extends beyond the spacers in a direction parallel to a top surface of the substrate.

7. The gate structure of claim 6, wherein the workfunction layer is an n-type work function layer and comprises at least one of La, Zr, Hf, V, Nb, Ta, Ti or a metal carbide.

8. The gate structure of claim 6, wherein the workfunction layer is a p-type work function layer and comprises at least one of Re, Fe, Ru, Co, Rh, Ir, Ni, Pd or Pt.

9. The gate structure of claim 6, wherein the gate electrode is in direct contact with the workfunction layer.

10. The gate structure of claim 6, wherein sidewalls of the barrier layer are in direct contact with the spacers.

11. The gate structure of claim 6, further comprising an adhesion layer between the gate electrode and the workfunction layer.

12. The gate structure of claim 11, wherein the adhesion layer comprises at least one of Ti, TiN, Ta, TaN.

13. The gate structure of claim 6, wherein a width of the gate electrode is constant from a top surface of the gate electrode to a bottom surface of the gate electrode.

14. The gate structure of claim 6, wherein the gate dielectric layer comprises a high-k dielectric material.

15. The gate structure of claim 6, further comprising an interfacial oxide layer between the gate dielectric layer and the substrate.

16. A semiconductor device comprising:
    a transistor, the transistor comprising:
    a substrate;
    a gate dielectric layer over the substrate;
    a workfunction layer over the gate dielectric layer, wherein a top surface of a center portion of the workfunction layer is a first distance above a top surface of the gate dielectric layer, wherein the first distance is from the top surface of the gate dielectric layer to the top surface of the center portion of the workfunction layer;
    a barrier layer between the gate dielectric layer and the workfunction layer, wherein the workfunction layer is over an entirety of a top surface of the barrier layer, and the barrier layer is over an entirety of a top surface of the gate dielectric layer; and
    spacers enclosing the gate dielectric layer and a first portion of the workfunction layer, wherein an inner surface of sidewalls of the spacers located more than the first distance above the top surface of the gate dielectric layer are free of the workfunction layer, and a second portion of the workfunction layer is outside a region enclosed by the spacers.

17. The gate structure of claim 16, further comprising a gate electrode over the workfunction layer, wherein the gate electrode is in direct contact with the spacers.

18. The gate structure of claim 17, further comprising an adhesion layer between the gate electrode and the workfunction layer.

19. The gate structure of claim 17, wherein the gate electrode is in direct contact with the workfunction layer.

20. The gate structure of claim 17, wherein a top surface of the gate electrode is above a top surface of the spacers.

* * * * *